United States Patent
Fujiwara (10) Patent No.: US 10,840,206 B2
(45) Date of Patent: Nov. 17, 2020

(54) METHOD OF MANUFACTURING SEMICONDUCTOR DEVICE

(71) Applicant: KYOCERA Corporation, Kyoto (JP)

(72) Inventor: Masakazu Fujiwara, Warabi (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/554,068

(22) Filed: Aug. 28, 2019

(65) Prior Publication Data

US 2019/0393181 A1    Dec. 26, 2019

Related U.S. Application Data (63) Continuation of application No. PCT/JP2018/000825, filed on Jan. 15, 2018.

(30) Foreign Application Priority Data

Feb. 28, 2017 (JP) ................ 2017-037506

(51) Int. Cl.
*H01L 23/00* (2006.01)

(52) U.S. Cl.
CPC ............ *H01L 24/27* (2013.01); *H01L 24/83* (2013.01); *H01L 2224/27505* (2013.01); *H01L 2224/29339* (2013.01); *H01L 2224/8384* (2013.01); *H01L 2924/01047* (2013.01); *H01L 2924/0635* (2013.01); *H01L 2924/095* (2013.01)

(58) Field of Classification Search
None
See application file for complete search history.

(56) References Cited

U.S. PATENT DOCUMENTS

| | | | |
|---|---|---|---|
| 4,856,185 A | 8/1989 | Baumgartner et al. | |
| 2012/0037688 A1 | 2/2012 | Kock et al. | |
| 2013/0256894 A1 | 10/2013 | Adema | |
| 2014/0131898 A1* | 5/2014 | Shearer | H01L 24/27 257/783 |
| 2017/0025374 A1* | 1/2017 | Fujiwara | C09J 11/04 |

FOREIGN PATENT DOCUMENTS

| | | |
|---|---|---|
| JP | 07-111981 B2 | 11/1995 |
| JP | 2012-517704 A | 8/2012 |

* cited by examiner

*Primary Examiner* — Alexander G Ghyka
(74) *Attorney, Agent, or Firm* — Volpe Koenig (57) ABSTRACT

A method of manufacturing a semiconductor device includes: applying a bonding resin composition on a semiconductor chip supporting member, the bonding resin composition containing a thermosetting resin and silver microparticles having an average particle size of 10 to 200 nm, the silver microparticles having a protective layer made of an organic compound on surfaces thereof; a semi-sintering step of heating the applied bonding resin composition at a temperature that is lower than a reaction starting temperature of the thermosetting resin and is equal to or more than 50° C. to bring the silver microparticles into a semi-sintered state; and a bonding step including: placing a semiconductor chip on the bonding resin composition containing the silver microparticles in a semi-sintered state, heating at a temperature higher than the reaction starting temperature of the thermosetting resin in a pressure-free state, and bonding the semiconductor chip to the semiconductor chip supporting member.

3 Claims, 1 Drawing Sheet

FIG. 1A

APPLICATION STEP

FIG. 1B

SEMI-SINTERING STEP

FIG. 1C-1

BONDING STEP

FIG. 1C-2

BONDING STEP

METHOD OF MANUFACTURING SEMICONDUCTOR DEVICE

CROSS-REFERENCE TO RELATED APPLICATIONS

This application is a continuation of prior International Application No. PCT/JP2018/000825, filed on Jan. 15, 2018 which is based upon and claims the benefit of priority from Japanese Patent Application No. 2017-037506, filed on Feb. 28, 2017; the entire contents of all of which are incorporated herein by reference.

FIELD

One aspect in this disclosure relates to a method of manufacturing a semiconductor device capable of imparting excellent thermal conductivity and electrical conductivity to a bonded portion between a supporting member and a semiconductor chip in manufacturing a semiconductor device.

BACKGROUND

With the increase in the capacity and processing speed and the advancement of wiring miniaturization of semiconductor products, heat generated during the operation of the semiconductor products has become a significant problem, and what is called thermal management that removes heat from the semiconductor products has attracted attention increasingly.

For this purpose, a method of attaching a heat dissipation member such as a heat spreader or a heat sink to the semiconductor product has been commonly employed, and a bonding material for bonding a semiconductor chip and the heat dissipation member is itself required to have higher thermal conductivity.

Further, a semiconductor device for power is getting more widely used not only for general industrial use and electric railroad use but also for on-vehicle use as environment consciousness increases. In particular, reduction in size and weight of each of on-vehicle parts in a limited allowable size is directly linked to the performance of the vehicle, and therefore the reduction in size also of the semiconductor device for power has attracted attention.

Such a semiconductor device has a semiconductor chip for power mounted, for example, on a die pad of a DBC (Direct Bonded Copper: registered trademark) substrate via a high-lead solder high in heat resistance. However, the use of harmful substance containing lead comes to be restricted, and making lead-free is demanded.

Thus, as a lead-free bonding material high in heat resistance other than the high-lead solder, a bonding method using sintered-type silver paste of bonding a silver filler of a nano-order at a temperature of a melting point or less is under review. The sintered-type silver paste is high in thermal conduction and is effective for bonding the semiconductor chip for power handling large current.

However, the high-lead paste and the sintered-type silver paste cause formation of fillet, squeeze-out onto an electrode on an upper surface of the chip (calf creep), and so on, which becomes one of the main causes of inhibiting the reduction in package size. Therefore, for example, there is suggested a method for bonding a semiconductor chip and a DBC substrate by a porous metallic film (refer to US-A1 2013/0256894).

Furthermore, US-A1 2014/0131898 discloses a manufacturing method of a semiconductor device in which a sintering die-attach material containing tin and copper alloy particles and tin and bismuth alloy particles is B-staged and then has a semiconductor chip mounted thereon to be post-cured.

SUMMARY

However, the method described in Patent Literature 1 has sometimes increased the possibility that voids present in a bonding layer adversely affect thermal conductivity and reliability.

Further, the sintering die-attach material described in Patent Literature 2 is used by being brought into a semi-sintered state, and thus is excellent in thermal conductivity, but has a risk that high-temperature shelf characteristics decrease because a solder compound is used.

Thus, one aspect in this disclosure has been made in order to solve the above-described problems and is to provide a method of manufacturing a semiconductor device capable of exhibiting excellent thermal conductivity and electrical conductivity and enabling high-density bonding between a semiconductor chip and a semiconductor chip supporting member.

It was found out that in the case of bonding a semiconductor chip using a bonding resin composition containing silver microparticles having a protective layer containing an organic compound on surfaces and a thermosetting resin, a heat treatment in which the protective layer attached to the surfaces of the silver microparticles is partly decomposed to bring the silver microparticles into a semi-sintered state is performed, thereby making it possible to improve the thermal conductivity and the electrical conductivity of a bonded portion.

That is, the method of manufacturing the semiconductor device in one aspect in this disclosure includes at least the following steps.

(1) a first step being an application step of applying a bonding resin composition on a semiconductor chip supporting member, the bonding resin composition containing a thermosetting resin and silver microparticles having an average particle size of 10 to 200 nm, the silver microparticles having a protective layer made of an organic compound on surfaces thereof;

(2) a second step being a semi-sintering step of heating the applied bonding resin composition at a temperature that is lower than a reaction starting temperature of the thermosetting resin and is equal to or more than 50° C. to bring the silver microparticles into a semi-sintered state; and (3) a third step being a bonding step including: placing a semiconductor chip on the bonding resin composition containing the silver microparticles in a semi-sintered state; heating at a temperature higher than the reaction starting temperature of the thermosetting resin in a pressure-free state; and bonding the semiconductor chip to the semiconductor chip supporting member.

According to the method of manufacturing the semiconductor device in one aspect in this disclosure, the bonding resin composition containing specific silver microparticles is used and the contained silver microparticles are brought into a semi-sintered state beforehand, thereby making it possible to pressure-free bond the semiconductor chip to the semiconductor chip supporting member thereafter.

Further, a cured product of the bonding resin composition that bonds the semiconductor chip in this manner can exhibit good adhesion strength even though no fillet is formed. This makes it possible to stably bond the semiconductor chip, achieve a reduction in size, and manufacture a high-density mounting-type semiconductor device.

BRIEF DESCRIPTION OF THE DRAWINGS

FIG. 1A to FIG. 1C-2 are views for explaining a method of manufacturing a semiconductor device being one embodiment in one aspect in this disclosure.

DETAILED DESCRIPTION

The method of manufacturing the semiconductor device in one aspect in this disclosure is performed by doing the above-described respective steps. Hereinafter, there will be explained one aspect in this disclosure with reference to a method of manufacturing a semiconductor device being one embodiment.

[Method of Manufacturing a Semiconductor Device]

The method of manufacturing the semiconductor device in this embodiment is including a predetermined application step, a predetermined semi-sintering step, and a predetermined bonding step as described above. Hereinafter, the respective steps will be explained in detail with reference to the drawing. FIG. 1A to FIG. 1C-2 are views for explaining the method of manufacturing the semiconductor device.

(Application Step)

Figure 1A:
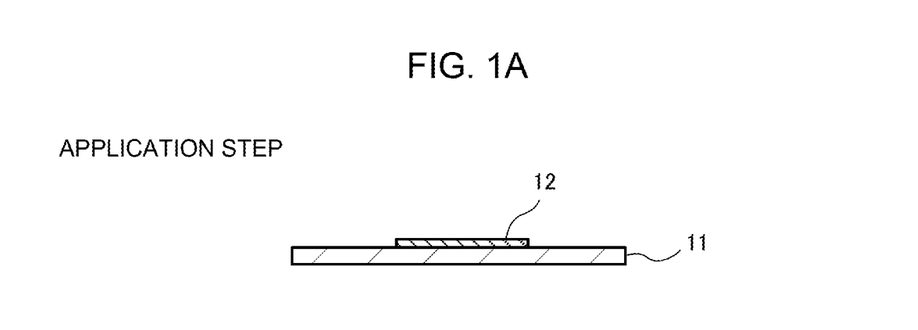

In the first step (application step), a predetermined bonding resin composition is applied on a semiconductor chip supporting member. By this application, a coating film 12 of the bonding resin composition is formed on a semiconductor chip supporting member 11 (FIG. 1A). This coating film 12 is to be formed at a place where a semiconductor chip is arranged according to a configuration of the semiconductor device to be manufactured, and can be formed at an arbitrary place.

Here, the coating film 12 to be formed may have a thickness of 10 μm to 120 μm. The application is performed so as to have a thickness falling within this range, thereby improving adhesiveness of a semiconductor chip and reliability of the semiconductor device.

Further, this application step can be performed without any limitation as long as it is performed by an application method that has been well known conventionally. Examples of the application method used here include methods such as screen printing, roll coating printing, a spraying method, a bar coating method, an ink-jet method, a dispenser method, a stamping method, and a transfer method.

The semiconductor chip supporting member and the semiconductor chip bonding resin composition, which are used here, will be explained below.

<Semiconductor Chip Supporting Member>

The semiconductor chip supporting member used in this embodiment can be used without any limitation in particular as long as it is a member capable of stably mounting the semiconductor chip thereon. Examples of the semiconductor chip supporting member include: lead frames such as a 42 alloy lead frame and a copper lead frame; plastic films of a polyimide resin, an epoxy resin, a polyimide-based resin, and the like; one obtained by impregnating a base material such as a nonwoven glass fabric with a resin composition containing a polyimide resin, an epoxy resin, a polyimide-based resin, and the like to be cured (prepreg); a supporting member made of ceramic such as alumina; and so on.

<Bonding Resin Composition>

The bonding resin composition used in this embodiment is containing a thermosetting resin and specific silver microparticles. The bonding resin composition is heated to bring the silver microparticles into a semi-sintered state. Further, the bonding resin composition is composed of such combinations as to prevent curing from progressing.

The thermosetting resin used here only needs to be a thermosetting resin to be used for bonding use of a semiconductor chip, and a well-known thermosetting resin can be used. Examples of the thermosetting resin include an acrylic resin, a cyanate resin, an epoxy resin, a maleimide resin, and so on.

Further, the silver microparticles used here only need to be ones having a protective layer (coating layer) of an organic compound on their surfaces. Their shape is not limited in particular, and examples of the shape include a plate shape, a flake shape, a scale shape, a branch shape, a rod shape, a wire shape, a spherical shape, and so on. An average particle size of the silver microparticles falls within a range of 10 to 200 nm. The average particle size of other than the spherical particle means an average size of short sides (minor axes or thicknesses).

Such forms can prevent the direct contact between the metal surfaces of the contained silver microparticles, to thereby hinder the formation of a mass in which the silver microparticles aggregate, and can keep the silver microparticles separately dispersed. That is, the plate-shaped, flake-shaped, or scale-shaped silver microparticles need to have a thickness satisfying the above-described range, and the branch-shaped, rod-shaped, or wire-shaped silver microparticles need have the shortest axis of cross-section diameters vertical to the major axis satisfying the above-described range.

Incidentally, this average particle size is measured by the arithmetic average of a particle size for about 100 samples randomly extracted under a transmission electron microscope (TEM) or a scanning electron microscope (SEM). The silver microparticles having the size satisfying the above-described range can be self-sintered by heating at about 150 to 250° C., to thereby improve thermal conductivity and electrical conductivity.

Further, the organic compound to be the protective layer only needs to be one capable of bringing the semi-sintered state of the silver microparticles into an appropriate state by being decomposed and removed by heating. Furthermore, the organic compound to be the protective layer may be provided on the surfaces of the silver microparticles as a relatively thin film. Furthermore, the protective layer may be provided relatively thick in such a state that the silver microparticles are dispersed in the organic compound.

As the organic compound used here, for example, an organic compound with a 20000 molecular weight or less having nitrogen, carbon, and oxygen as constituent elements is cited. The organic compound contained in the silver microparticles having this organic compound may be 0.1 to 2.5 mass % to 100 mass % of the silver microparticles containing this organic compound. That is, this organic compound controls sintering of the silver microparticles prior to the later-described semi-sintering step. This organic compound is decomposed and removed by the semi-sintering step, thereby enabling sintering of the silver microparticles.

(Semi-Sintering Step)

Figure 1B:
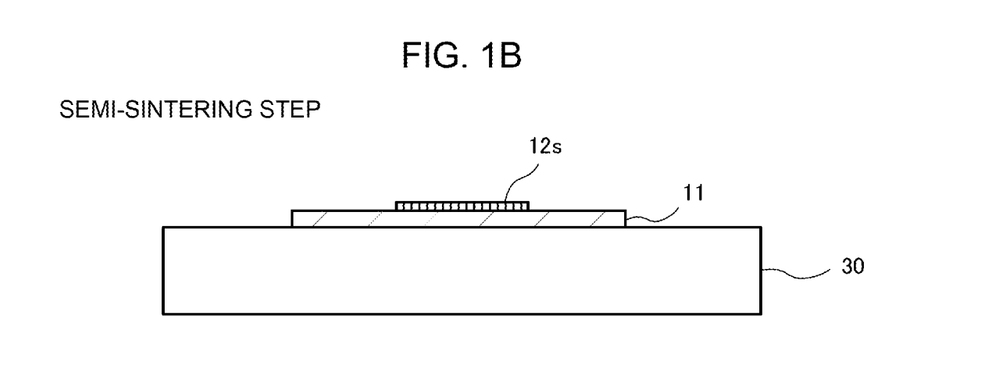

In the second step (semi-sintering step), the bonding resin composition (coating film 12) applied on the semiconductor chip supporting member 11 is heated, to thereby bring the silver microparticles in the bonding resin composition into a semi-sintered state to form a bonding resin composition 12s (FIG. 1B).

The silver microparticles of the bonding resin composition are brought into a semi-sintered state as above, thereby making it possible to improve thermal conductivity and electrical conductivity of a cured product obtained by curing in the later-described bonding step.

In the semi-sintering step, curing of the bonding resin composition is prevented from progressing. In order to make such a state, in this semi-sintering step, it is heated at a temperature that is lower than a reaction starting temperature of the used thermosetting resin and is equal to or more than 50° C. The heating can be performed by using a well-known heating means such as a heater, but heating conditions are slightly mild, and thus the heating can also be performed by preparing a hot plate 30 and performing hearing on the hot plate 30 as illustrated in FIG. 1B (FIG. 1B).

A heating temperature in this semi-sintering step is a temperature lower than a self-sintering temperature of the silver microparticles, and may be 50 to 150° C., further 60 to 100° C., or 60 to 80° C., for example. A heating time period in the semi-sintering step is set appropriately so as to make a desired semi-sintered state. Incidentally, the heating time period may be set to 30 minutes or less from the viewpoint of working efficiency.

Incidentally, in this description, the semi-sintered state of the silver microparticles means a state where a part of the protective layer of the organic compound being the protective layer present on the surfaces of the silver microparticles is decomposed and removed and the silver microparticles are fused to each other or the silver microparticles are fused to other metal particles (partially sintered). In this state, the sintering is not completed. It means that heating makes a more sinterable state.

The semi-sintered state of the silver microparticles can be managed by controlling mass % of the protective layer because of having a good correlation with mass % of the protective layer covering the surfaces of the silver microparticles. Concretely, it is possible to maintain a good semi-sintered state when the protective layer made of an organic substance on the silver microparticles is 0.1 to 2.5 mass %.

Here, regarding the semi-sintered state, the degree of semi-sintering is 1% or more, may be less than 50%, or may also be less than 25%. The case of being less than 1% is not suitable for high-density bonding because fillet formation, squeeze-out onto an electrode on an upper surface of the chip (calf creep), and so on may occur, and when the sintering progresses at 50% or more, activity of the resin composition may decrease.

In this embodiment, the semi-sintered state is determined according to the type, amount, and so on of the protective layer of an organic compound on the surfaces of the silver microparticles, the type of the bonding resin composition (coating film) formed on the semiconductor chip supporting member, heating conditions of bonding, or the like.

Here, the degree of semi-sintering can be found as a ratio of the number of adjacent microparticles bonded to each other from a SEM image of the heated silver microparticles. Concretely, 100 pieces of silver microparticles are randomly extracted from a SEM image at 30,000-fold to 100,000-fold magnification, out of the 100 pieces of microparticles, the number of adjacent microparticles bonded to each other (partially sintered) is counted, and the ratio of sintered microparticles is found, thereby enabling evaluation.

(Bonding Step)

Figure 1C:
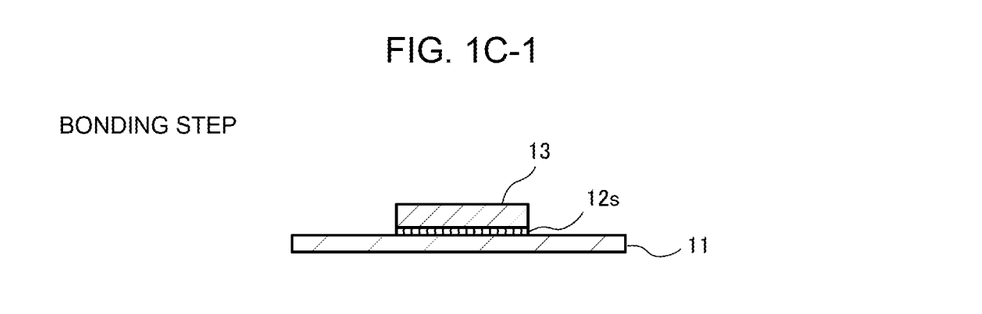
Figure 1C:
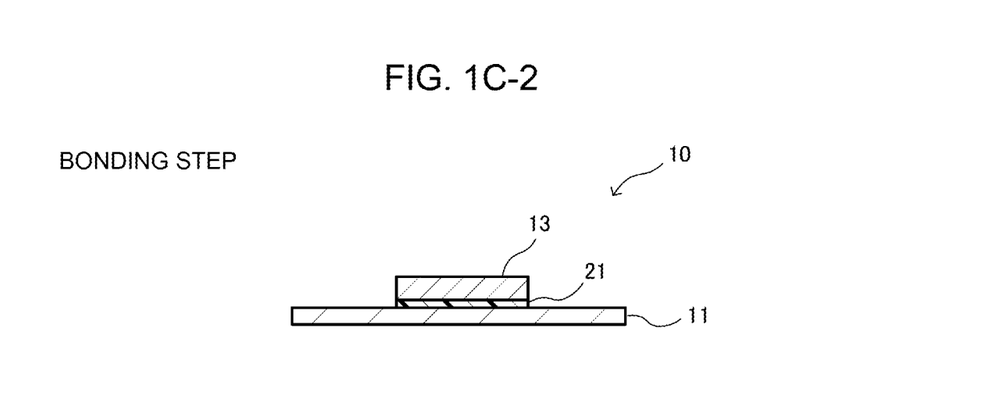

In the third step (bonding step), on the bonding resin composition containing the silver microparticles in a semi-sintered state, which is formed in the second step (semi-sintering step), a semiconductor chip 13 is placed (FIG. 1C-1) to be further heated, and thereby the bonding resin composition is cured. In this manner, the semiconductor chip 13 is bonded to the semiconductor chip supporting member 11 with a cured product 21 of the bonding resin composition intervening therebetween (FIG. 1C-2).

The heating in this bonding step is performed at a temperature higher than the reaction starting temperature of the resin composition. Heating at such a temperature enables curing of the resin to progress. Further, in this heating, sintering of the silver microparticles further progresses, to thereby improve the electrical conductivity and the thermal conductivity of the cured product. Incidentally, in this bonding step, as for the above-described bonding, sufficient bonding is enabled even in a pressure-free state, resulting in obtaining a stable and highly-reliable semiconductor device.

A heating temperature in this bonding step may be, for example, 150 to 300° C. or further 200 to 250° C. A heating time period in the bonding step is set appropriately so as to achieve stable bonding of the semiconductor chip.

Incidentally, the heating in this bonding step may be performed in conjunction with a postcuring step of a sealing material for sealing the semiconductor chip unless there is interference in a mounting and assembling step.

By the method of manufacturing the semiconductor device in this embodiment, the semiconductor device having a bonded portion excellent in thermal conductivity and electrical conductivity can be obtained. As the semiconductor device manufactured here, one having the same structure as that of a well-known semiconductor device can be cited. A representative semiconductor device is configured by including, for example, a semiconductor chip mounting substrate with predetermined wirings formed on a supporting substrate, a die bonding layer, a semiconductor chip, wires connecting the above-described wirings and terminals of the semiconductor chip, and a sealing material sealing at least wire connection portions.

Further, the bonding resin composition used for the method of manufacturing the semiconductor device in this embodiment may be a bonding resin composition to be described below even though the one explained above can be used.

As this bonding resin composition, a bonding resin composition containing (A) a (meth)acrylic acid ester compound or (meth)acrylamide compound having a hydroxyl group, (B) a radical initiator, (C) silver microparticles, (D) a silver powder, and (E) a solvent can be cited concretely. Hereinafter, there will be explained these respective components in detail.

The (meth)acrylic acid ester compound or (meth)acrylamide compound having a hydroxyl group being the component (A) used here is (meth)acrylate or (meth)acrylamide having (meth)acrylic group or more in one molecule and also contains the hydroxyl group.

The (meth)acrylate having the hydroxyl group can be obtained through a reaction of a polyol compound with (meth)acrylic acid and its derivative. As this reaction, a well-known reaction is usable, and acrylic ester or acrylic acid whose molar quantity is about 0.5 to 5 times that of the polyol compound is ordinarily used.

Further, the (meth)acrylamide having the hydroxyl group can be obtained through a reaction of an amine compound having a hydroxyl group with (meth)acrylic acid and its derivative. In the method of producing (meth)acrylamides through the reaction of the (meth)acrylic ester and the amine compound, a double bond of the (meth)acrylic ester is very rich in reactivity, and thus an intended product is usually produced by adding amine, cyclopentadiene, alcohol, or the like in advance as a protecting group to the double bond and eliminating the protecting group by heating after the amidation is finished. With the hydroxyl group being thus contained, sinterability due to a reducing effect is promoted and adhesiveness improves.

Further, the hydroxyl group mentioned here is an alcoholic group in which a hydrogen atom of an aliphatic hydrocarbon group is substituted. The content of this hydroxyl group may be 1 to 50 pieces in one molecule, and when the content of the hydroxyl group is within this range, sinterability is not hindered by excessive curing.

Examples of such an acrylic resin compound having a hydroxyl group include compounds expressed by the following general formulas (I) to (IV).

[Chem. 1]

(I)

where, in the formula, $R^1$ represents a hydrogen atom or a methyl group, and $R^2$ represents a bivalent aliphatic hydrocarbon group or an aliphatic hydrocarbon group having a ring structure, with a carbon number of 1 to 100.

[Chem. 2]

(II)

where, in the formula, $R^1$ and $R^2$ represent the same as above.

[Chem. 3]

(III)

where, in the formula, $R^1$ represents the same as above, and n represents an integer 1 to 50.

[Chem. 4]

(IV)

where, in the formula, $R^1$ and n represent the same as above.

As this (meth)acrylate or (meth)acrylamide, any of the above-described compounds is usable alone or a combination of two types or more of them is usable. Incidentally, the carbon number of $R^2$ in the general formulas (I) and (II) may be 1 to 100, or may also be 1 to 36. When the carbon number of $R^2$ is within this range, sinterability is not hindered by the excessive curing.

The radical initiator being the component (B) used here is not limited in particular and a catalyst used for radical polymerization is normally usable. For example, a decomposition temperature may be 100 to 190° C. in a rapid heating test (measurement test of a kick-off temperature when a 1 g sample is placed on a hot plate and heated at 4° C./minute). There is a possibility that when this decomposition temperature is less than 100° C., it becomes difficult to control a bonded state of the semiconductor chip because the semi-sintered state of the silver microparticles and a semi-cured state of the thermosetting resin progress in parallel, and when the decomposition temperature exceeds 190° C., a curing time of the thermosetting resin becomes extremely long. Incidentally, here, the kick-off temperature is set to a temperature when the mass of the sample decreases by 1% relative to the mass of the sample prior to heating.

Examples of the radical initiator used when the kick-off temperature satisfies the above-described condition include 1,1-bis(t-butylperoxy)-2-methylcyclohexane, t-butyl peroxyneodecanoate, dicumyl peroxide, and so on.

The radical initiator being the component (B) may be used alone, or in order to control curability, a mixture of two types or more of them may be used. Further, in order to improve storage stability of a die attach paste, various types of polymerization inhibitors can also be added in advance.

A compounding amount of this radical initiator being the component (B) may be 0.1 to 10 parts by mass to 100 parts by mass of the component (A). There is a possibility that when the compounding amount exceeds 10 parts by mass, the die attach paste greatly changes in viscosity with time and when the compounding amount is less than 0.1 parts by mass, curability greatly decreases.

The silver microparticles being the component (C) used here have the protective layer (coating layer) of the organic compound on the surfaces as explained above. The average particle size of the silver microparticles falls within a range of 10 to 200 nm. The organic compound provided as the protective layer on the surfaces of the silver microparticles being the component (C) may be an organic compound containing a functional group such as an amino group or a carboxyl group concretely.

An example of the organic compound containing the carboxyl group used here is one type of organic compound or more with a 110 to 20000 molecular weight selected from organic carboxylic acids, and examples thereof include carboxylic acids such as hexanoic acid, heptanoic acid, octanoic acid, nonanoic acid, decanoic acid, undecanoic acid, dodecanoic acid, tetradecanoic acid, eicosanoic acid, docosanoic acid, 2-ethylhexanoic acid, oleic acid, linolic acid, linolenic acid, and dipropionic acid-terminated polyethylene oxide. Further, as the above-described organic compound, a carboxylic acid derivative of any of the above-described carboxylic acids is also usable.

Further, examples of the organic compound containing the amino group used here include alkylamine, and so on, and examples thereof include: primary amines such as butylamine, methoxyethylamine, 2-ethoxyethylamine, hexylamine, octylamine, 3-butoxypropylamine, nonylamine, dodecylamine, hexadodecylamine, octadecylamine, cocoamine, tallow amine, tallow amine hydroxide, oleylamine, laurylamine, stearylamine, and 3-aminopropyltriethoxysilane; secondary amines such as dicocoamine, dihydrogenated tallow amine, and distearylamine; tertiary amines such as dodecyldimethylamine, didodecylmonomethylamine, tetradecyldimethylamine, octadecyldimethylamine, cocodimethylamine, dodecyl tetradecyldimethylamine, and trioctylamine; and besides, diamines such as naphthalenediamine, stearylpropylenediamine, octamethylenediamine, nonandiamine, diamine-terminated polyethylene oxide, triamine-terminated polypropylene oxide, and diamine-terminated polypropylene oxide.

When the molecular weight of the organic compound attached to the surfaces of the silver microparticles is over 20000, the organic compound becomes difficult to be detached from the surfaces of the silver microparticles, which may become difficult to obtain a desired semi-sintered state. Accordingly, the molecular weight of the organic compound covering the surfaces may be small from this viewpoint. Further, the molecular weight may be 50 or more, and when the molecular weight is less than 50, the organic compound becomes easy to be detached from the metal particle surfaces and the particles become easy to aggregate each other, which may become difficult to obtain a desired semi-sintered state consequently.

When the organic compound covering or dispersing the silver microparticles being the component (C) falls within the above-described range, partial sintering with the silver powder being the component (D) progresses rather than the aggregation of the silver microparticles being the component (C), resulting in obtaining a stable semi-sintered state.

This protective layer of the organic substance on the silver microparticles being the component (C) may be 0.1 to 2.5 mass %. When this protective layer is smaller than 0.1 mass %, it becomes insufficient to control the aggregation and sintering in the resin composition progresses preferentially, which may cause a risk of voids due to a decrease in adhesion strength or rise in viscosity, and when the protective layer is larger than 2.5 mass %, a risk of occurrence of voids due to the above-described organic compound remaining in the sintered cured product and a decrease in electrical conductivity may be caused.

Further, the shape of the silver microparticles being the component (C) is not limited in particular as described above, but as the shape, at least one type of silver microparticles selected from (C1) plate-shaped silver microparticles and (C2) spherical silver microparticles may be included.

The plate-shaped silver microparticles being the component (C1) used here are plate-shaped thin particles having a uniform thickness, which are obtained through the growth of one metal crystal plane to a large size, unlike spherical nanoparticles, and their examples include well-known plate-shaped silver microparticles that can be compounded in a resin composition. In general, they have a micron order size, an about several nanometer thickness, and a shape of a triangle plate, a hexagonal plate, a truncated triangle plate, or the like. Further, their upper surfaces may be widely covered with [111] planes.

A resin composition that contains the plate-shaped silver microparticles being the component (C1) is higher in thermal conductivity than an ordinary one filled only with a silver powder. Further, the plate-shaped silver microparticles sinter mainly in the thickness direction, thus having a small internal stress as compared to one using spherical silver nano-microparticles. Further, it becomes a bonding material excellent in reflectivity due to high orientation of the silver microparticles. Further, since the plate-shaped silver microparticles being the component (C1) are less susceptible to an influence of the presence or absence of oxygen unlike ordinary silver microparticles (silver nanoparticles), they are capable of sintering under an atmosphere of inert gas such as nitrogen.

A median particle size of the plate-shaped silver microparticles being the component (C1) may be 0.3 to 15 μm. With the median particle size of the plate-shaped silver microparticles being within this range, their dispersibility in the resin component can be improved. Further, the median particle size of the plate-shaped silver microparticles is within this range, thereby making it possible to reduce nozzle clogging and a strain of a chip during the assembly of a semiconductor chip. Here, the median particle size refers to a 50% integrated value (50% particle size) in a volume-based particle size distribution curve that is obtained through measurement with a laser diffraction particle size analyzer. That is, this median particle size is different from the above-described average particle size of short sides in that the median particle size is calculated in consideration also of their long sides.

Further, their thicknesses may fall within 10 to 200 nm. These thicknesses are measured through data processing of observation images obtained by a transmission electron microscope (TEM) or a scanning electron microscope (SEM). This average thickness is calculated as a number average thickness in the following manner.

Thicknesses measured from the observation images of [n+1] pieces of plate-shaped silver microparticles (n+1 is, for example, about 50 to 100 pieces) are arranged in order from a thick thickness to a thin thickness, a range of the thicknesses (largest thickness: $x_1$, smallest thickness: $x_{n+1}$) is n-divided, and each thickness section is defined as [$x_j$, $x_{j+1}$] (j=1, 2, ..., n). The division in this case is equisection on a logarithmic scale. Further, a typical thickness in each of the thickness sections is expressed by the following expression based on the logarithmic scale.

$$\frac{\log_{10} x_j + \log_{10} x_{j+1}}{2} \quad \text{[Exp. 1]}$$

Further, when $r_j$ (j=1, 2, ..., n) is a relative amount (difference %) corresponding to the section [$x_j$, $x_{j+1}$] and the total value of all the sections is 100%, an average value μ can be calculated on the logarithmic scale by the following expression.

$$\mu = \frac{1}{100} \sum_{j=1}^{n} r_j \frac{\log_{10} x_j + \log_{10} x_{j+1}}{2} \quad \text{[Exp. 2]}$$

Since this μ is a numerical value on the logarithmic scale and does not have a unit as the thickness, $10^\mu$ is found, that is, 10 raised to the μth power is calculated in order to return it to a value having a thickness unit. This $10^\mu$ is defined as the number average thickness.

Further, the longer side in a direction vertical to the thickness direction may be within a range of 8 to 150 times, or may be 10 to 50 times, as large as the thickness. Further, the shorter side in a direction vertical to the thickness direction may be within a range of 1 to 100 times or may be 3 to 50 times, as large as the thickness.

The plate-shaped silver microparticles being the component (C1) are self-sinterable at 100 to 250° C. The silver microparticles containing the silver microparticles thus self-sintering at 100 to 250° C. have improved flowability at the time of thermal curing, resulting in an increase in contact points between the silver microparticles, and in addition, an increase in the areas of the contact points, leading to a great improvement in electrical conductivity. Accordingly, a sintering temperature of the plate-shaped silver microparticles may be 100 to 200° C. Incidentally, self-sinterable mentioned here means sinter when heated at a temperature lower than a melting point without a pressure being applied, or without an additive or the like being added.

Further, the plate-shaped silver microparticles being the component (C1) may be monocrystalline. The monocrystalline structure can ensure electrical conductivity in low-temperature curing.

The plate-shaped silver microparticles being the component (C1) are oriented in a horizontal direction in a coating film and have a larger number of contact points, thereby capable of improving electrical conductivity. This is because, at the time of the thermal curing, they are naturally oriented in the coating film so as to be stacked in the thickness direction due to a compression effect by the weight of the chip and due to a volume decrease effect that the volume of the resin composition shrinks as a result of a decrease in its volatile component, its curing shrinkage, or the like, so that the contact points between the silver microparticles can be large.

The particle sizes of the spherical silver microparticles being the component (C2) used here fall within 10 to 200 nm. Incidentally, the particle sizes are measured through data processing of observation images obtained by a transmission electron microscope (TEM) or a scanning electron microscope (SEM). Further, the average particle size of the spherical silver microparticles being the component (C2) may be within the above-described range. This average particle size is calculated as a number average particle size of the particle sizes measured from the observation images of 50 to 100 pieces of the spherical silver microparticles. As this number average particle size, an average value may be calculated, as in the calculation of the above-described average thickness.

The silver powder being the component (D) used here is a silver powder having an average particle size of greater than 0.25 µm and 30 µm or less, and may be a silver powder as an inorganic filler that is ordinarily added in a resin adhesive to impart electrical conductivity. Micron-order silver particles like the silver powder being the component (D) are additionally added to the above-described silver microparticles being the component (C), thereby capable of further improving a bonding strength between the semiconductor chip and the supporting member. Further, examples of the shape of the silver particles used here include a flake shape, a scale shape, a branch shape, a rod shape, a wire shape, a spherical shape, a plate shape, and so on. Incidentally, this average particle size is calculated by laser diffractometry.

Here, the silver microparticles being the component (C) and the silver powder being the component (D) are compounded so as to make the above-described component (A) become 1 to 20 parts by mass to 100 parts by mass being the total amount of them as described above. When the component (A) is less than 1 part by mass, an amount of the silver component becomes too large, which may make the viscosity too high, leading to a handling difficulty, and when the component (A) exceeds 20 parts by mass, a ratio of the silver component decreases, which may make ensuring high thermal conductivity insufficient to lower a heat dissipation property.

Incidentally, with the total amount of the component (C) and the component (D) being 100 parts by mass, a mass ratio of the component (C):the component (D) may be 10:90 to 90:10. When a ratio of the component (C) to the component (D) is too small, it is difficult to ensure high thermal conductivity, and when the ratio of the component (C) is too large, adhesion strength to a non-metallic body may worsen.

Any well-known solvent functioning as a reducing agent can be used as the solvent being the component (E) used here. This solvent may be alcohol and an example thereof is aliphatic polyhydric alcohol. Examples of the aliphatic polyhydric alcohol include glycols such as ethylene glycol, diethylene glycol, propylene glycol, dipropylene glycol, 1,4-butanediol, glycerin, and polyethylene glycol, and so on. These solvents are each usable alone or a combination of two types or more of them is usable.

The temperature of the alcohol solvent functioning as the reducing agent becomes high due to a heat treatment at the time of the curing (sintering) of the paste, so that the alcohol has an increased reducing power. Thereby, silver oxide present in part of the silver microparticles being the component (C) and the silver powder being the component (D), and metal oxide (for example, copper oxide) on the metal substrate are reduced by the alcohol to be pure metals. As a result, it is thought to be a reason why the cured film that is dense, has high electrical conductivity, and has high adhesion with the substrate can be formed. Further, the alcohol partly comes into a reflux state during the heat treatment at the time of the curing of the paste, since it is sandwiched between the semiconductor chip and the metal substrate, so that the alcohol as the solvent is not lost from the system immediately due to the volatilization, and the metal oxide is more efficiently reduced at a paste curing temperature equal to or more than the boiling point.

The boiling point of this solvent may be 100 to 300° C., or 150 to 290° C. When the boiling point is less than 100° C., since volatility becomes high even at room temperature and thus the reducing power is likely to deteriorate due to the volatilization of the dispersion medium, and stable adhesion strength no longer can be obtained. Further, when the boiling point exceeds 300° C., since the sintering does not easily occur in the conductive film and thus the film lacks denseness, and the solvent may remain in the film without volatilizing.

A compounding amount of this solvent being the component (E) may be 7 to 20 parts by mass to 100 parts by mass being the total amount of the component (C) and the component (D). When this compounding amount is less than 7 parts by mass, the viscosity increases and workability may decrease, and when it exceeds 20 parts by mass, the viscosity decreases and the silver in the paste may sink and reliability may decrease.

In the bonding resin composition described here, besides the above components, a curing accelerator, a stress reducing agent such as rubber or silicone, a coupling agent, a defoaming agent, a surface active agent, a coloring agent (pigment, dye), and various types of additives that are ordinarily compounded in this kind of composition can be compounded as required within a range not obstructing the contents in this disclosure. One type out of these additives may be used alone or a mixture of two types or more of them may be used.

In preparing the bonding resin composition in this embodiment, the above-described components (A) to (E), additives such as the coupling agent compounded as required, and so on are fully mixed. Then, a mixed resin composition is kneaded using a disperse, a kneader, a three-roller mill, and so on. Finally, a kneaded resin composition is defoamed, and thereby the preparation is performed.

Further, the viscosity of the resin composition obtained at this time (25° C.) may be 5 to 300 Pa·s. The semi-sintered state is correlative to the rate of change of the viscosity, and the semi-sintered state can be managed by managing the rate of change of the viscosity. The viscosity being 5 or more facilitates control of occurrence of dripping or the like of the bonding resin composition supplied on the substrate by application by means of a printing method to well maintain a printed form. Further, the viscosity being 300 Pa·s or less facilitates control of occurrence of "lacking," "thinning," or like of the bonding resin composition supplied on the substrate by application by means of a printing method.

EXAMPLES

[Preparation of Silver Microparticles]

Synthesis Example 1

203 g of silver nitrate (produced by KANTO CHEMICAL CO., INC., first grade) and 82 g of ammonium oxalate-hydrate (produced by KANTO CHEMICAL CO., INC., extra pure) were dissolved in order in a pure water to be stirred and mixed for 12 hours at room temperature to obtain 180 g of silver oxalate. 238 mg (0.78 mmol) of the silver oxalate and 348 mg (3.12 mmol) of n-butylamine (produced by KANTO CHEMICAL CO., INC.) were mixed and stirred for one minute at room temperature to prepare a silver oxalate-alkylamine complex.

To this, 6 mL of 1-butanol (produced by KANTO CHEMICAL CO., INC.) and 0.141 mg of NaCl were added to be heated and stirred for 15 minutes at 100° C., and then a reaction with foaming of $CO_2$ was completed and a silver precipitate was generated. To this, 10 mL of methanol (produced by KANTO CHEMICAL CO., INC., first grade) was added, a precipitate obtained by centrifugal separation was dried naturally, and then plate-shaped silver microparticles 1 having a thickness of about 20 nm and a major axis of about 100 nm were obtained.

In order to examine the content of protective molecules of a silver microparticle powder obtained in Synthesis example 1, a thermogravimetry differential thermal analysis (TG-DTA) was performed. A two-stage mass decrease was seen by heating from room temperature to 250° C. Further, when the temperature exceeded 400 to 500° C., the mass decrease stopped and the mass became fixed, and 1.5 mass % of a mass decrease rate at this time is the mass of organic protective molecules covering the surfaces of the silver microparticles.

Synthesis Example 2

Silver microparticles 2 were obtained by the same operation as that of Synthesis example 1 except that 15 mL of methanol was added to the silver precipitate. The silver microparticles 2 obtained here are the same in size and shape as the silver microparticles 1. The silver microparticles 2 were different from the silver microparticles 1 only in that the mass of the organic protective layer covering the surfaces of them was 1.2 mass %.

Synthesis Example 3

Silver microparticles 3 were obtained by the same operation as that of Synthesis example 1 except that 20 mL of methanol was added to the silver precipitate. The silver microparticles 3 obtained here are the same in size and shape as the silver microparticles 1. The silver microparticles 3 were different from the silver microparticles 1 only in that the mass of the organic protective layer covering the surfaces of them was 0.8 mass %.

Synthesis Example 4

Silver microparticles 4 were obtained by the same operation as that of Synthesis example 1 except that 40 mL of methanol was added to the silver precipitate. The silver microparticles 4 obtained here are the same in size and shape as the silver microparticles 1. The silver microparticles 4 were different from the silver microparticles 1 only in that the mass of the organic protective layer covering the surfaces of them was 0.05 mass %.

Synthesis Example 5

Silver microparticles 5 were obtained by the same operation as that of Synthesis example 1 except that 5 mL of methanol was added to the silver precipitate. The silver microparticles 5 obtained here are the same in size and shape as the silver microparticles 1. The silver microparticles 5 were different from the silver microparticles 1 only in that the mass of the organic protective layer covering the surfaces of them was 3 mass %.

Examples 1 to 3, Comparative Examples 1 to 4

Components were mixed according to the compositions in Table 1 and were kneaded with a roll, and thereby resin compositions A to E were obtained.

The obtained resin compositions A to E for bonding were used, and semiconductor devices were manufactured by performing treatments under the following conditions to be evaluated respectively. Results are illustrated in Table 2 collectively.

Incidentally, as materials used in the examples and the comparative examples, the following commercially available products were used except for the above-described silver microparticles prepared in Synthesis examples 1 to 5.

[Component (A)]

Thermosetting resin: hydroxyethylacrylamide (produced by Kohjin Co., Ltd., brand name: HEAA)

[Component (B)]

Polymerization initiator: dicumyl peroxide (produced by NOF Corporation, brand name: PERCUMYL D; decomposition temperature in rapid heating test: 126° C.)

[Component (C)]

(C1) Plate-Shaped Silver Microparticles

Silver microparticles 1 (plate-shaped silver microparticles obtained in Synthesis example 1; thickness 20 nm, major axis 100 nm, organic protective layer 1.5 mass %)

Silver microparticles 2 (plate-shaped silver microparticles obtained in Synthesis example 2; thickness 20 nm, major axis 100 nm, organic protective layer 1.2 mass %)

Silver microparticles 3 (plate-shaped silver microparticles obtained in Synthesis example 3; thickness 20 nm, major axis 100 nm, organic protective layer 0.8 mass %)

Silver microparticles 4 (plate-shaped silver microparticles obtained in Synthesis example 4; thickness 20 nm, major axis 100 nm, organic protective layer 0.05 mass %)

Silver microparticles 5 (plate-shaped silver microparticles obtained in Synthesis example 5; thickness 20 nm, major axis 100 nm, organic protective layer 3 mass %)

(C2) Spherical Silver Microparticles

Silver microparticles 6 (produced by Mitsuboshi Belting Ltd., brand name: MDot; average particle size: 50 nm, organic protective layer 1.5 mass %)

[Component (D)]

Silver powder (produced by Fukuda Metal Foil & Powder Co., Ltd., brand name: AgC-212D; average particle size: 5 μm)

[Component (E)]

Solvent: diethylene glycol (produced by Tokyo Chemical Industry Co., Ltd.)

(3) Mount a 6 mm×6 mm silicon chip and a chip with a gold rear surface having a surface to be bonded provided with a gold deposition layer on the PPF.

(4) Heat the PPF having had the chips mounted thereon for one hour in an oven at 200° C. and cure the resin composition to obtain a semiconductor device.

(5) Observe the obtained semiconductor device to confirm the presence or absence of fillet occurrence and the presence or absence of squeeze-out onto a chip side surface (calf creep) to evaluate them under the following references.

○: neither fillet occurrence nor squeeze-out onto a chip side surface (calf creep) is confirmed ×: fillet occurrence or squeeze-out onto a chip side surface (calf creep) is confirmed

[Thermal-Time Adhesion Strength Evaluation Procedure]

(1) Apply the resin composition to a PPF (Ni—Pd/Au-plated copper frame) to have a 60 μm thickness.

TABLE 1

| | | | Resin composition A | Resin composition B | Resin composition C | Resin composition D | Resin composition E |
|---|---|---|---|---|---|---|---|
| Composition (parts by mass) | (A) | Thermosetting resin | 10 | 10 | 10 | 10 | 10 |
| | (B) | Polymerization initiator | 1 | 1 | 1 | 1 | 1 |
| | (C) | Silver microparticles 1 | 30 | | | | |
| | | Silver microparticles 2 | | 30 | | | |
| | | Silver microparticles 3 | | | 27 | | |
| | | Silver microparticles 4 | | | | 30 | |
| | | Silver microparticles 5 | | | | | 30 |
| | | Silver microparticles 6 | | | 3 | | |
| | (D) | Silveer powder | 70 | 70 | 70 | 70 | 70 |
| | (E) | Solvent | 10 | 10 | 10 | 10 | 10 |

TABLE 2

| | | Example | | | Comparative example | | | |
|---|---|---|---|---|---|---|---|---|
| | | 1 | 2 | 3 | 1 | 2 | 3 | 4 |
| Resin composition | | A | B | C | D | E | A | A |
| Sem-sintering condition | Heating temperature (° C.) | 70 | 70 | 70 | 70 | 70 | 40 | 150 |
| Evaluation result | Viscosity (Pa · s) | 120 | 100 | 150 | 300 | 50 | 120 | 120 |
| | External appearance (void) | ○ | ○ | ○ | × | × | × | ○ |
| | Thermal-time adhesion strength (N) | 27 | 27 | 27 | 5 | 17 | 27 | Unevaluable |
| | Electrical resistance | $4 \times 10^{-6}$ | $4 \times 10^{-6}$ | $4 \times 10^{-6}$ | $5 \times 10^{-3}$ | $7 \times 10^{-4}$ | $4 \times 10^{-6}$ | Unevaluable |
| | Thermal conductivity (W/mK) | 200 | — | — | — | — | 200 | Unevaluable |
| | Reflow resistance | 0 | — | — | — | — | 0 | Unevaluable |
| | Thermal shock resistance | 0 | — | — | — | — | 0 | Unevaluable |

<Evaluation Method>

[Viscosity]

The viscosity of the resin composition was measured at 25° C. using an E-type viscometer with a diameter of 19.4 mm and a 3° cone manufactured by Told Sangyo Co., Ltd (the number of rotations 0.5 min$^{-1}$).

[External Appearance Evaluation Procedure]

(1) Apply the resin composition to a PPF (Ni—Pd/Au-plated copper frame) to have a 60 μm thickness.

(2) Heat the applied resin composition for 15 minutes at each temperature of 40° C. (Comparative example 3), 70° C. (Examples 1 to 4, Comparative examples 1 to 2), and 150° C. (Comparative example 4) as the semi-sintering treatment condition.

(2) Heat the applied resin composition for 15 minutes at each temperature of 40° C. (Comparative example 3), 70° C. (Examples 1 to 4, Comparative examples 1 to 2), and 150° C. (Comparative example 4) as the semi-sintering treatment condition.

(3) Mount a 6 mm×6 mm silicon chip and a chip with a gold rear surface having a surface to be bonded provided with a gold deposition layer on the PPF.

(4) Heat the PPF having had the chips mounted thereon for one hour in an oven at 200° C. and cure the resin composition to obtain a semiconductor device.

(5) Perform a moisture absorption treatment (85° C., relative humidity 85%, 72 hours) on this semiconductor device.

(6) Measure thermal-time die shear strength (shear) at 260° C. using a mounting strength measuring device.

[Electrical Resistance Evaluation Procedure]
(1) Apply the resin composition to a glass substrate (1 mm thickness) to have a 10 mm×10 mm area and a 60 μm thickness.
(2) Heat the applied resin composition for 15 minutes at each temperature of 40° C. (Comparative example 3), 70° C. (Examples 1 to 4, Comparative examples 1 to 2), and 150° C. (Comparative example 4) as the semi-sintering treatment condition.
(3) Heat the glass substrate for 60 minutes at 200° C. and cure the resin composition.
(4) Measure volume resistance (Ω·cm) of the obtained cured resin composition by a four-terminal method, using MCP-T600 (manufactured by Mitsubishi Chemical Corporation, brand name).

[Thermal Conductivity Evaluation Procedure]
(1) Apply the resin composition to a Teflon (registered trademark) sheet (1 mm thickness) to have a 1 mm thickness.
(2) Heat the applied resin composition for 15 minutes at each temperature of 40° C. (Comparative example 3) and 70° C. (Example 1) as the semi-sintering treatment condition.
(3) Cure the resin composition for one hour in an oven at 200° C. to create a test piece.
(4) Measure thermal conductivity of the test piece by a laser flash method (measurement method: JIS R 1611-1997).

[Package-Crack Resistance]
[IR Reflow Resistance Evaluation Procedure]
(1) Apply the above-described resin composition to a PPF (Ni—Pd/Au-plated copper frame) to have a 60 μm thickness.
(2) Heat the applied resin composition for 15 minutes at each temperature of 40° C. (Comparative example 3) and 70° C. (Example 1) as the semi-sintering treatment condition.
(3) Pressure-free mount a 6 mm×6 mm silicon chip and a chip with a gold rear surface having a to be boded surface provided with a gold deposition layer on the PPF.
(4) Heat the PPF having had the chips mounted thereon for one hour in an oven at 200° C. and cure the resin composition to obtain a semiconductor device.
(5) Resin-seal and mold the semiconductor device under the following condition, using an epoxy sealing material produced by KYOCERA Chemical Corporation (brand name: KE-G3000D).
(6) Perform a moisture absorption treatment on the molded semiconductor device at 85° C., at a 85% relative humidity, and for 168 hours.
(7) Perform IR reflowing (260° C., 10 seconds) on the moisture-absorbed semiconductor device.
(8) Observe the presence or absence of internal cracks occurred in the semiconductor device under an ultrasonic microscope for five samples.
(9) Count the sample in which cracks occurred.

[Thermal Shock Resistance Evaluation Procedure]
(1) Use the same test piece as that used for the above-described IR reflowing.
(2) Perform a thermal cycle treatment (1000 cycles, one cycle being an operation of increasing the temperature from −55° C. to 150° C. and cooling to −55° C. again).
(3) Observe the presence or absence of internal cracks occurred in each package under an ultrasonic microscope for five samples.
(4) Count the sample in which cracks occurred.

[Manufacturing Conditions of the Semiconductor Device to be Subjected to Evaluations of IR Reflow Resistance and Thermal Shock Resistance]
package: 80 pQFP (14 mm×20 mm×2 mm thickness)
chip: silicon chip and chip having a gold-plated rear surface
lead frame: PPF and copper
molding of sealing material: 175° C., two minutes
post-mold cure: 175° C., eight hours According to the method of manufacturing the semiconductor device in one aspect in this disclosure (Examples 1 to 3), the bonding resin composition containing specific silver microparticles is used and the contained silver microparticles are brought into a semi-sintered state in advance, and thereby the semiconductor chip can be pressure-free bonded to the semiconductor chip supporting member.

Further, a cured product of the bonding resin composition to bond the semiconductor chip as above can exhibit good adhesion strength unless fillet is formed. This enables stable bonding of the semiconductor chip, a reduction in size, and manufacture of a high-density mounting-type semiconductor device.

The case of using the resin composition D containing the silver microparticles 4 with a small amount of the organic protective layer as the component (C), which were obtained in Synthesis example 4, as in Comparative example 1, is inferior in storage stability and has a tendency that sintering progresses excessively inside the resin composition because the protective layer is detached easily. Therefore, the adhesion strength decreases in the case of pressure-free bonding.

Further, the case of using the resin composition E containing the silver microparticles 5 with a large amount of the organic protective layer as the component (C) in Synthesis example 5, as in Comparative example 2, has a tendency that sintering does not progress easily because the protective layer on the silver microparticles is not detached easily, and the adhesion strength decreases and the volume resistance increases in the case of pressure-free bonding.

In the case where the heating temperature in the semi-sintering step is less than 50° C. even when the organic protective layer is within an appropriate range as the (C) component, as in Comparative example 3, voids occur easily because the volatility of the solvent in the resin composition is weak in the case of pressure-free bonding.

In the case where the heating temperature in the semi-sintering step is higher than the reaction starting temperature even when the organic protective layer is within an appropriate range as the component (C), as in Comparative example 4, the sintering of the silver microparticles progresses in the semi-sintering step, thus failing to bond between the PPF and the chip.

What is claimed is:
1. A method of manufacturing a semiconductor device comprising:
an application step of applying a bonding resin composition on a semiconductor chip supporting member, the bonding resin composition containing a thermosetting resin and silver microparticles having an average particle size of 10 to 200 nm, the silver microparticles having a protective layer made of an organic compound with a 20,000 molecular weight or less having nitrogen, carbon, and oxygen as constituent elements on surfaces thereof;
a semi-sintering step of heating the applied bonding resin composition at a temperature that is lower than a reaction starting temperature of the thermosetting resin and is equal to or more than 50° C. to bring the silver microparticles into a semi-sintered state; and
a bonding step including: placing a semiconductor chip on the bonding resin composition containing the silver microparticles in a semi-sintered state; heating at a temperature higher than the reaction starting temperature of the thermosetting resin in a pressure-free state; and bonding the semiconductor chip to the semiconductor chip supporting member;

wherein the organic compound forming the protective layer is 0.1 to 2.5 mass % in the silver microparticles when the silver microparticles having the protective layer are set to 100 mass %.

2. The method of manufacturing the semiconductor device according to claim 1, wherein the bonding resin composition contains, as essential components, (A) a (meth)acrylic acid ester compound or (meth)acrylamide compound having a hydroxyl group, (B) a radical initiator, (C) silver microparticles having an average particle size of 10 to 200 nm, the silver microparticles having a protective layer made of an organic compound on surfaces thereof, (D) a silver powder having an average particle size of 0.25 to 30 μm and, (E) a solvent, and wherein the bonding resin composition contains only particles made of silver as a filler.

3. The method of manufacturing the semiconductor device according to claim 2, wherein the (B) radical initiator has a decomposition temperature of 100 to 180° C., and the bonding resin composition is heated at 60 to 80° C.

* * * * *